(12) United States Patent
Yamagata

(10) Patent No.: US 9,376,761 B2
(45) Date of Patent: Jun. 28, 2016

(54) SINGLE-CRYSTAL SILICON PULLING SILICA CONTAINER AND METHOD FOR PRODUCING THE SAME

(71) Applicant: SHIN-ETSU QUARTZ PRODUCTS CO., LTD., Tokyo (JP)

(72) Inventor: Shigeru Yamagata, Narashino (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 270 days.

(21) Appl. No.: 14/006,169

(22) PCT Filed: Nov. 8, 2012

(86) PCT No.: PCT/JP2012/007164
§ 371 (c)(1),
(2) Date: Sep. 19, 2013

(87) PCT Pub. No.: WO2013/105165
PCT Pub. Date: Jul. 18, 2013

(65) Prior Publication Data
US 2014/0283737 A1    Sep. 25, 2014

(30) Foreign Application Priority Data
Jan. 13, 2012 (JP) ................................. 2012-005174

(51) Int. Cl.
*C30B 15/10* (2006.01)
*C30B 35/00* (2006.01)
(Continued)

(52) U.S. Cl.
CPC .............. *C30B 15/10* (2013.01); *C03B 19/095* (2013.01); *C30B 11/002* (2013.01); *C30B 29/06* (2013.01); *C30B 29/18* (2013.01); *C30B 35/002* (2013.01); *Y02P 40/57* (2015.11); *Y10T 117/1032* (2015.01)

(58) Field of Classification Search
CPC .... C30B 15/10; C30B 35/002; C30B 11/002; C30B 29/18
USPC .................................................. 117/200, 206
See application file for complete search history.

(56) References Cited

U.S. PATENT DOCUMENTS

| 4,935,046 A | 6/1990 | Uchikawa et al. |
| 5,885,071 A | 3/1999 | Watanabe et al. |

(Continued)

FOREIGN PATENT DOCUMENTS

| CN | 101956231 A | 1/2011 |
| CN | 102224113 A | 10/2011 |

(Continued)

OTHER PUBLICATIONS

Dodd et al., "Optical Determinations of OH in Fused Silica," *Journal of Applied Physics*, 1966, vol. 37, p. 3911.

(Continued)

*Primary Examiner* — Matthew Song
(74) *Attorney, Agent, or Firm* — Oliff PLC

(57) ABSTRACT

The present invention is directed to a single-crystal silicon pulling silica container, the silica container including a straight body portion, a curved portion, and a bottom portion, wherein the OH group concentration in the straight body portion is 30 to 300 ppm by mass, the OH group concentration in the bottom portion is 30 ppm by mass or less, and the difference in the OH group concentration between the straight body portion and the bottom portion is 30 ppm by mass or more. As a result, a low-cost single-crystal silicon pulling silica container, the silica container that can reduce cavity defects called voids and pinholes in pulled single crystal silicon, is provided.

17 Claims, 6 Drawing Sheets

(51) Int. Cl.
*C30B 11/00* (2006.01)
*C30B 29/18* (2006.01)
*C30B 29/06* (2006.01)
*C03B 19/09* (2006.01)

(56) References Cited

U.S. PATENT DOCUMENTS

| | | | |
|---|---|---|---|
| 2009/0165701 A1* | 7/2009 | Kishi | C30B 15/10 117/13 |
| 2010/0132608 A1 | 6/2010 | Morikawa et al. | |
| 2010/0147213 A1* | 6/2010 | Harada | C03B 19/095 117/208 |
| 2010/0162947 A1 | 7/2010 | Harada et al. | |
| 2011/0114530 A1* | 5/2011 | Yamagata | C03B 19/095 206/524.6 |
| 2011/0143063 A1 | 6/2011 | Yamagata et al. | |
| 2011/0240663 A1* | 10/2011 | Yamagata | C03B 19/095 220/660 |
| 2011/0272322 A1* | 11/2011 | Yamagata | C03B 19/095 206/524.6 |

FOREIGN PATENT DOCUMENTS

| | | |
|---|---|---|
| CN | 102301041 A | 12/2011 |
| EP | 2 075 354 A2 | 7/2009 |
| JP | A-4-22861 | 4/1992 |
| JP | B2-7-29871 | 4/1995 |
| JP | A-9-255476 | 9/1997 |
| JP | A-10-25184 | 1/1998 |
| JP | A-2005-162499 | 6/2005 |
| JP | A-2010-126423 | 6/2010 |
| JP | A-2010-155760 | 7/2010 |
| JP | A-2010-155765 | 7/2010 |
| JP | A-2011-121811 | 6/2011 |
| JP | A-2012-116716 | 6/2012 |
| WO | WO 2010/137221 A1 | 12/2010 |
| WO | WO 2011070703 A1 * | 6/2011 ............ C03B 19/095 |

OTHER PUBLICATIONS

Nasu et al., "Gas Release of Various Kinds of Vitreous Silica," *Journal of Illuminating Engineering Institute of Japan*, 1990, vol. 74, No. 9, pp. 595-600.
International Search Report issued in International Patent Application No. PCT/JP2012/007164 dated Dec. 11, 2012 (with translation).
International Preliminary Report on Patentability issued in International Patent Application No. PCT/JP2012/007164 dated Jul. 15, 2014.
Jun. 3, 2015 Extended Search Report issued in European Application No. 12864795.5.
Office Action issued in Taiwanese Patent Application No. 101144176 dated Jun. 13, 2014 (with partial translation).
Aug. 5, 2015 Office Action issued in Chinese Application No. 201280017718.0.
Apr. 6, 2016 Office Action issued in Chinese Application No. 2012800177180.

* cited by examiner

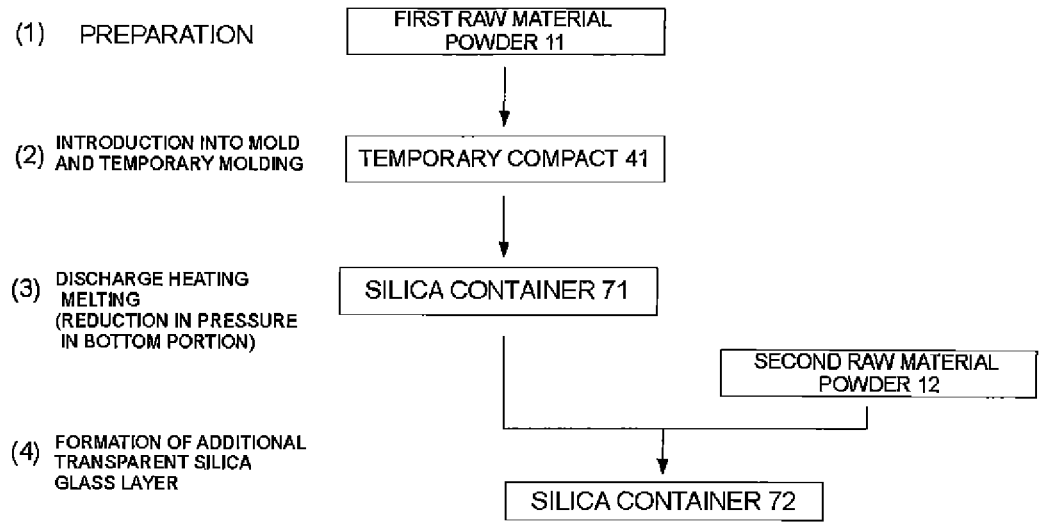
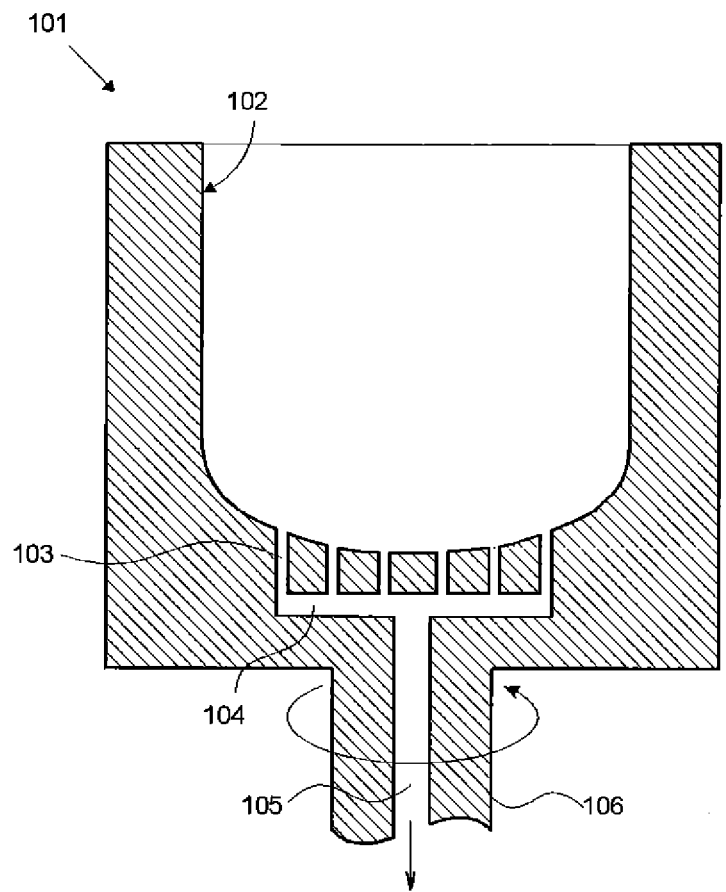

SINGLE-CRYSTAL SILICON PULLING SILICA CONTAINER AND METHOD FOR PRODUCING THE SAME

TECHNICAL FIELD

The present invention relates to a single-crystal silicon pulling silica container and a method for producing the silica container.

BACKGROUND ART

In the past, as a method for producing a silica crucible for producing single crystal silicon for LSIs, the production methods described in Patent Literature 1 and Patent Literature 2 have been used. These methods are the methods by which, after quartz powder or synthetic cristobalite powder which was processed to be ultrapure is charged into a rotating mold and is molded, electrodes are pushed thereinto from above and voltage is applied to the electrodes to produce arc discharge, whereby the temperature of an atmosphere is raised to a melting temperature range (which is estimated to be about 1800 to 2100° C.) of the quartz powder to melt and sinter the quartz powder. However, since ultrapure quartz raw material powder is used in these production methods, these production methods are high in cost. Moreover, problems related to production cost and the quality of single crystal silicon has arisen, such as silicon monoxide (SiO) gas that is generated as a result of the reaction between molten silicon and a silica crucible when the produced silica crucible is used and is then taken into single crystal silicon as gaseous bubbles. Furthermore, there arises a problem of impurity contamination from the silica crucible, the impurity contamination which is the diffusion of impurity metal elements from a crucible wall when the single crystal silicon is pulled upwardly. In the following description, a silica crucible and a quartz crucible are synonymous with each other.

Moreover, in Patent Literature 3, a silica crucible having a three-layer structure formed of an outer layer made of natural quartz glass, an intermediate layer made of synthetic quartz glass containing a high concentration of aluminum, and an inner layer made of high-purity synthetic quartz glass based on an arc discharge melting method of silica powder raw materials (an atmosphere at the time of melting is estimated to be the air) is disclosed. In addition, the effect of preventing the movement of impurities (shielding effectiveness) by the intermediate layer is disclosed. However, in addition to the high cost of the three-layer structure, the problem of gaseous bubbles contained in the produced single crystal silicon is not solved.

Furthermore, in Patent Literature 4, a technique of reducing gaseous bubbles in a melted silica crucible wall by suction under a reduced pressure from the periphery of a molding die at the time of arc discharge melting of a silica powder raw material compact is disclosed. However, it is impossible to eliminate dissolved gas in the silica crucible wall completely only by sucking in the air present in a temporary compact of the silica powder under a reduced pressure. Moreover, there is a problem of SiO gas that is generated by the reaction between molten silicon and a silica crucible when the silica crucible is used and is taken into single crystal silicon as gaseous bubbles.

In addition, in Patent Literature 5, a quartz glass crucible that can prevent the generation of cavity defects called cavities (voids), non-through small-diameter holes (pinholes), and the like in a silicon wafer, the cavity defects caused as a result of SiO gas bubbles being taken into single crystal silicon, is disclosed. As a way of preventing it, providing projections and depressions formed as many scratches having a depth of 50 to 450 µm in at least part of the inner surface of a straight body portion and a curved portion of a crucible is disclosed. However, with such an irregular surface, degassing of the generated SiO gas to the outside of a silica container is inadequate, and, in particular, when a silicon single crystal has a large diameter of 12 inches (300 mm) or more, it is difficult to achieve a sufficient reduction of cavities (voids) and non-through small-diameter holes (pinholes) in a silicon wafer made by slicing and polishing such a silicon single crystal.

Moreover, also in Patent Literature 6, a quartz glass crucible that can prevent the generation of cavity defects caused as a result of SiO gas bubbles being taken into a silicon single crystal is disclosed. As a way, forming a region with high light transmittance in the bottom portion of a crucible is disclosed, whereby an increase in the temperature of the bottom portion is suppressed and it is possible to prevent the generation of SiO gas. However, inadequate suppression of the reaction between a quartz crucible and silicon melt is achieved by merely adjusting the light transmittance.

Furthermore, also in Patent Literature 7, similarly, an invention that can prevent the generation of cavity defects caused as a result of SiO gas bubbles being taken into a silicon single crystal is disclosed. As a way, setting a region with a high Al concentration in a bottom portion inner surface layer portion of a crucible is disclosed, whereby the viscosity of the bottom portion at a high temperature is increased and it is possible to prevent scratches and depressions reliably. However, since the Al concentration is in the high concentration range of 30 to 150 ppm, there arises a problem of an Al element taken into the produced single crystal silicon.

CITATION LIST

Patent Literature

Patent Literature 1: Japanese Examined Patent Application Publication No. H4-22861
Patent Literature 2: Japanese Examined Patent Application Publication No. H7-29871
Patent Literature 3: Japanese Unexamined Patent Application Publication No. H9-255476
Patent Literature 4: Japanese Unexamined Patent Application Publication No. H10-25184
Patent Literature 5: Japanese Unexamined Patent Application Publication No. 2010-126423
Patent Literature 6: Japanese Unexamined Patent Application Publication No. 2010-155765
Patent Literature 7: Japanese Unexamined Patent Application Publication No. 2010-155760

SUMMARY OF INVENTION

Technical Problem

The present invention has been made in view of the problems described above and an object thereof is to provide a low-cost single-crystal silicon pulling silica container, the silica container that can reduce cavity defects called voids and pinholes in pulled single crystal silicon, and a method for producing such a silica container.

Solution to Problem

The present invention has been made to solve the above-described problems and provides a single-crystal silicon pulling silica container, the silica container including a straight body portion, a curved portion, and a bottom portion, wherein the OH group concentration in the straight body portion is 30 to 300 ppm by mass, the OH group concentration in the bottom portion is 30 ppm by mass or less, and a difference in the OH group concentration between the straight body portion and the bottom portion is 30 ppm by mass or more.

With the silica container in which the OH group concentrations in individual parts are in the above-described ranges, when the silica container is used at a high temperature of about 1500° C. at the time of silicon melting, since the OH group concentration is low in the container bottom portion, it is possible to increase the viscosity. This makes it possible to suppress the generation of SiO gas by the reaction between silica ($SiO_2$) and molten silicon (Si) in the container bottom portion. Moreover, since the OH group concentration in the silica container bottom portion is low, it is also possible to suppress the generation of $H_2O$ and $O_2$ gas from the container bottom portion at the time of silicon melting. As a result, it is possible to reduce cavity defects called voids and pinholes in a single crystal silicon wafer produced from a pulled single crystal silicon ingot.

In this case, an outside of the straight body portion may be made of opaque silica glass containing gaseous bubbles, the inside of the straight body portion may be made of transparent silica glass containing substantially no gaseous bubble, and the bottom portion may be made of translucent silica glass containing fewer gaseous bubbles than the opaque silica glass or transparent silica glass containing substantially no gaseous bubble.

With such a silica container, it is possible to heat the inside of the container uniformly with a double structure of the straight body portion and further suppress the generation of gas caused by gaseous bubbles in the bottom portion.

Moreover, it is preferable that an amount of released $H_2O$ in the bottom portion is $1 \times 10^{17}$ molecules/cm$^3$ or less.

By setting the amount of released $H_2O$ in the container bottom portion in this manner, it is possible to reduce $H_2O$ molecules released into silicon melt from the container bottom portion and reduce cavity defects called voids and pinholes in a silicon wafer more effectively.

Furthermore, it is preferable that Ba is contained in an inner surface layer of the bottom portion in concentrations of 100 to 1000 ppm by mass or Ba is applied to an inner surface of the bottom portion in concentrations of 100 to 1000 μg/cm$^2$.

As described above, when Ba is present in an inner surface portion of the bottom portion of the single-crystal silicon pulling silica container, the inner surface of the silica container is recrystallized at a temperature of about 1500° C. at the time of silicon melting and cristobalite is generated, whereby it becomes possible to further improve resistance to silicon melt etching. By reducing the amount of melting on the surface of a silica container inner wall, it is possible to further reduce SiO gas, $H_2O$ gas, and $O_2$ gas that are released at the time of silicon melting and reduce the amount of oxygen in a silicon crystal and reduce the generation of crystal defects (such as cavity defects). Moreover, cristobalite has the effect of reducing the diffusion of impurity metal elements contained in the container into the silicon melt.

In addition, the present invention provides a method for producing a single-crystal silicon pulling silica container, the silica container including a straight body portion, a curved portion, and a bottom portion, the method including: a step of making silica powder having a particle size of 10 to 1000 μm as first raw material powder; a step of obtaining a temporary compact by charging the first raw material powder into a mold having rotational symmetry, the mold with a bottom portion having holes for pressure reduction, and temporarily molding the first raw material powder into a predetermined shape corresponding to an inner wall of the mold by rotating the mold; and a discharge heating melting step of performing heating and melting of the temporary compact by a discharge heating melting method with carbon electrodes placed in the temporary compact while supplying gas containing hydrogen by performing degassing by reducing pressure from an outside of the mold in a bottom portion of the temporary compact.

With such a method, it is possible to make the OH group concentration in the container bottom portion lower than the OH group concentration in the container straight body portion. This makes it possible to suppress the generation of SiO gas by the reaction between silica ($SiO_2$) and molten silicon (Si) in the container bottom portion when the silica container is used at a high temperature of about 1500° C. at the time of silicon melting.

Moreover, the present invention provides a method for producing a single-crystal silicon pulling silica container, wherein the above-described method for producing a single-crystal silicon pulling silica container includes: a step of making silica powder having a particle size of 10 to 1000 μm, the silica powder whose purity is higher than the purity of the first raw material powder, as second raw material powder; and a step of further forming a transparent silica glass layer containing substantially no gaseous bubble on an inner surface of the silica container by heating and melting the second raw material powder by the discharge heating melting method while spreading the second raw material powder from an upper part of the silica container at least after the discharge heating melting step of the temporary compact.

With such a method, it is possible to further form a high-purity transparent silica glass layer on the inner surface of the silica container. As a result, it is possible to further suppress the diffusion of impurity elements into the silicon melt.

In this case, a barium compound may be mixed into the second raw material powder for forming the transparent silica glass layer on the inner surface of the bottom portion of the silica container in such a way that the Ba concentration becomes 100 to 1000 ppm by mass.

Furthermore, the method for producing a single-crystal silicon pulling silica container, the method of the present invention, may include a step of applying a barium compound solution to the inner surface of the bottom portion of the silica container in such a way that the concentration of Ba becomes 100 to 1000 μg/cm$^2$ and drying the barium compound solution.

With these methods, it is possible to allow Ba to be present in the inner surface of the single-crystal silicon pulling silica container. As a result, the inner surface of the silica container is recrystallized at a temperature of about 1500° C. at the time of silicon melting, which makes it possible to generate cristobalite.

Advantageous Effects of Invention

With a single-crystal silicon pulling silica container according to the present invention, when the silica container is used at a high temperature of about 1500° C. at the time of silicon melting, since the OH group concentration in a container bottom portion is low, it is possible to increase the viscosity. This makes it possible to suppress the generation of SiO gas by the reaction between silica ($SiO_2$) and molten silicon (Si) in the container bottom portion. Moreover, since the OH group concentration in the silica container bottom portion is low, it is also possible to suppress the generation of H₂O and O₂ gas from the container bottom portion at the time of silicon melting. As a result, it is possible to reduce cavity defects called voids and pinholes in a produced single crystal silicon wafer. On the other hand, in a container straight body portion, it is possible to suppress the diffusion of impurity elements into silicon melt. Furthermore, with a method for producing a single-crystal silicon pulling silica container according to the present invention, it is possible to produce such a silica container at low cost.

BRIEF DESCRIPTION OF DRAWINGS

FIG. 4 is a flow diagram of the outline of another example of the method for producing a silica container according to the present invention;

FIG. 5 is a schematic sectional view of an example of a mold that can be used in the method for producing a silica container according to the present invention;

DESCRIPTION OF EMBODIMENTS

Figure 1:
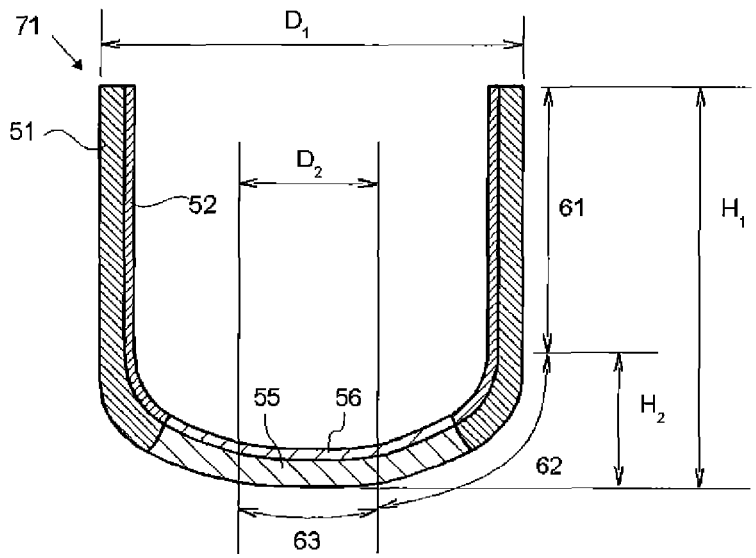
FIG. 1 is a schematic sectional view schematically depicting an example of the structure of a silica container according to the present invention.

Since a single-crystal silicon pulling silica container is becoming larger and the weight of a polysilicon raw material with which the container is filled is increased as the diameter of single crystal silicon to be produced becomes larger, gaseous bubbles contained in silicon melt remains in the melt and these gaseous bubbles are taken into single crystal silicon which is being produced, resulting in an increase in defects generated in a silicon wafer produced from this single crystal silicon, the defects called cavities (voids) and non-through small-diameter holes (pinholes). It is estimated that the cause of these defects is argon (Ar) or the like filled as atmospheric gas at the time of production of single crystal silicon, argon (Ar) or the like that is adsorbed onto the inner surface of the silica container, and silicon monoxide (SiO) gas that is generated by the reaction between the silica container and silicon (Si) that is melted in the container. The challenge of the present invention is to reduce cavity defects called voids and pinholes in the produced single crystal silicon.

In the present invention, it is necessary to solve the above-described technical challenge at the same cost as a crucible for pulling high-purity single crystal silicon or at lower cost than the crucible for pulling high-purity single crystal silicon, the crucible produced by an existing production method.

Moreover, a silica container for pulling an LSI or solar single-crystal silicon requires uniform heating properties inside of the container in a heating high-temperature atmosphere. To achieve this, it is preferable that at least a straight body portion of the silica container has a two-layer structure and the outside thereof is made of porous opaque silica glass and the inside thereof is made of transparent silica glass containing substantially no gaseous bubble.

Moreover, when impurity metal elements contained in the silica container, not only alkali metal elements Li, Na, and K, for example, but also, in particular, Ti, Cr, Fe, Ni, Cu, Zn, Zr, Mo, W, Pb, and the like are taken into single crystal silicon at the time of production of the single crystal silicon, the photoelectric conversion efficiency is reduced in a solar silicon device, for example. Therefore, it is preferable to provide the silica container with a highly-pure inner surface to prevent the impurities contained in the silica container from diffusing to silicon melt.

Hereinafter, a single-crystal silicon pulling silica container according to the present invention and a method for producing the silica container will be described in detail with reference to the drawings, but the present invention is not limited thereto. In particular, the following description will be given, mainly taking up a crucible of a container for pulling single crystal silicon that is a material of a solar cell (solar photovoltaic power generation, solar-electric power generation) as an example to which the present invention can be suitably applied, but the present invention is not limited thereto and can also be applied to, for example, a single-crystal silicon pulling silica container for large-scale integrated circuits (LSIs).

A single-crystal silicon pulling silica container according to the present invention will be described with reference to FIG. 1. As depicted in FIG. 1, a silica container 71 according to the present invention has a straight body portion 61, a curved portion 62, and a bottom portion 63. At this time, for the sake of convenience, ⅓ of the outer diameter ($D_1$) of the silica container 71 is assumed to be the diameter ($D_2$) of the bottom portion 63. The straight body portion 61 corresponds to a portion (height $H_1$-$H_2$) from an upper edge of the silica container 71 to a portion located at ⅓ of the height ($H_1$) thereof. Moreover, of a portion (height $H_2$) from the portion located at ⅓ of the height ($H_1$) of the silica container 71 to the bottom portion 63, a portion other than the bottom portion 63 is assumed to be the curved portion 62.

In the silica container 71 according to the present invention, the OH group concentration in the straight body portion 61 is 30 to 300 ppm by mass, the OH group concentration in the bottom portion 63 is 30 ppm by mass or less, and the difference in the OH group concentration between the straight body portion 61 and the bottom portion 63 is 30 ppm by mass or more. It is preferable that the OH group concentration in the bottom portion 63 is 10 ppm by mass or less. Moreover, it is preferable that the difference in the OH group concentration between the straight body portion 61 and the bottom portion 63 is 60 ppm by mass or more. Incidentally, the OH group concentration in the curved portion 62 of the silica container 71 is a value intermediate between the OH groups of the straight body portion 61 and the bottom portion 63, but it is not limited to a particular value.

If the OH group concentration in the bottom portion 63 of the silica container 71 is such an OH group concentration, when the silica container is used at a high temperature of about 1500° C. at the time of silicon melting, since the OH group concentration in the bottom portion 63 is low, it is possible to increase the viscosity. Therefore, it becomes possible to suppress the generation of SiO gas by the reaction between silica ($SiO_2$) and molten silicon (Si) in the bottom portion 63. As a result, it is possible to prevent the mixing of gaseous bubbles into a single crystal silicon ingot to be pulled upwardly and reduce cavity defects called voids and pinholes in a single crystal silicon wafer produced from the single crystal silicon ingot. Moreover, since the OH group concentration in the silica container bottom portion 63 is low, it is also possible to suppress the generation of $H_2O$ and $O_2$ gas into the silicon melt from the bottom portion 63.

It is estimated that most of the SiO gas generated as a result of the reaction between the molten silicon and the surface of the silica container while single crystal silicon is being pulled upwardly is generated as minute gaseous bubbles that adhere to the inner surface of the silica container, the diameters of the gaseous bubbles are gradually increased, and the gaseous bubbles rise in the silicon melt with an increase in the buoyancy of the gaseous bubbles. At this time, if the gaseous bubbles rise while adhering to the inner surface of the silica container and are then released to the outside of the silicon melt, the effects thereof on the single crystal silicon are eliminated. However, if the gaseous bubbles separate from the inner surface of the silica container and are contained in a central area of the silicon melt circulating by convection, the gaseous bubbles are taken into single crystal silicon and eventually generate voids and pinholes. The temperature of the container bottom portion 63 becomes especially high during the melting of silicon, and the reaction between the molten silicon and silica is particularly likely to occur. Moreover, since the position in which the SiO gas generated in the container bottom portion 63 was generated is located immediately below the single crystal silicon to be pulled upwardly, and, in addition to that, due to the influence of the convection of the silicon melt, the SiO gas generated in the container bottom portion 63 is taken into the single crystal silicon to be pulled upwardly more easily than the SiO gas generated in the straight body portion 61. Therefore, in the present invention, by lowering the OH group concentration in the bottom portion 63 of the silica container 71, the viscosity of the bottom portion 63 is increased to suppress this reaction. On the other hand, by setting the above-described OH group concentration in the straight body portion 61, it is possible to suppress the diffusion of impurity elements into the silicon melt as will be described later.

Moreover, it is preferable that the outside of the straight body portion 61 of the silica container 71 is made of opaque silica glass containing gaseous bubbles (an opaque silica glass layer 51) and the inside of the straight body portion 61 is made of transparent silica glass containing substantially no gaseous bubble (a transparent silica glass layer 52). Furthermore, it is preferable that the bottom portion 63 is made of translucent silica glass containing fewer gaseous bubbles than the opaque silica glass or transparent silica glass containing substantially no gaseous bubble (a translucent silica glass layer or a transparent silica glass layer 55, 56). Incidentally, the opaque silica glass layer is usually white and opaque, and the transparent silica glass layer is usually colorless and transparent. In addition, the gaseous bubble density and the color tone of the silica glass in the curved portion 62 of the silica container 71 lies about halfway between the gaseous bubble densities and the color tones of the straight body portion 61 and the bottom portion 63, but they are not limited to particular gaseous bubble density and color tone.

As described above, it is preferable that at least the straight body portion 61 of the silica container 71 has a two-layer structure whose outside is the opaque silica glass layer 51 and inside is the transparent silica glass layer 52. The bulk density of the opaque silica glass layer 51 located on the outside of the straight body portion 61 is about 1.90 to 2.15 ($g/cm^3$), and the bulk density of the transparent silica glass layer 52 located on the inside of the straight body portion 61 is approximately 2.20 ($g/cm^3$). On the other hand, it is preferable that at least the bottom portion 63 of the silica container 71 has no obvious two-layer structure and has an opaque or transparent single layer structure (the translucent silica glass layer or the transparent silica glass layer 55, 56). With such a structure, when the silica container is used at a high temperature, it is possible to heat the inside of the container 71 uniformly with the two-layer structure of the straight body portion 61 and further suppress the generation of gas caused by gaseous bubbles in the bottom portion 63.

The purity of the silica container 71 depends on the intended use, but it is preferable that the silica ($SiO_2$) purity is 99.99% by mass or more in the silica container 71 for pulling a solar single crystal and is 99.999% by mass or more in the silica container 71 for pulling a single crystal for LSIs. Moreover, even when, for example, silica powder with a content of each of alkali metal elements Li, Na, and K of about 10 ppm by mass is used as raw material powder from which the silica container 71 is produced, by setting the OH group concentration at 30 to 300 ppm by mass in the straight body portion 61 and, at the same time, setting Al at 5 to 30 ppm by mass, it becomes possible to adsorb and confine these elements with large diffusion constant values in the thickness of the silica container. As the effect of the OH group in the silica glass, it has the good effect of adsorbing and fixing the metal impurity element but has the negative effect of increasing the amount of etching by the silicon melt at a high temperature. Therefore, as described above, in the straight body portion 61, the concentration is set at 30 to 300 ppm by mass, and, in the bottom portion 63, the concentration is set at 30 ppm by mass or less. As for Al, it has the effect of adsorbing and fixing the metal impurity element and the good effect of increasing the viscosity of the silica glass at a high temperature, but has the negative effect of contaminating silicon with Al, the silicon which is an object to be processed. Therefore, when Al is added, the concentration thereof is set at 5 to 30 ppm by mass and preferably at 10 to 20 ppm by mass.

The details of the mechanism of how these Al and the OH group prevent the impurity metal elements from moving and diffusing in the silica glass is unknown, but it can be considered that Al adsorbs positive ions (cations) of the impurity metal elements and suppresses diffusion of those ions in order to keep electric charge balance of a silica glass network when Al is replaced by Si. Moreover, it is estimated that the OH group produces the effect of adsorbing the impurity metal elements or preventing diffusion thereof by the replacement of a metal ion with a hydrogen ion.

Figure 2:
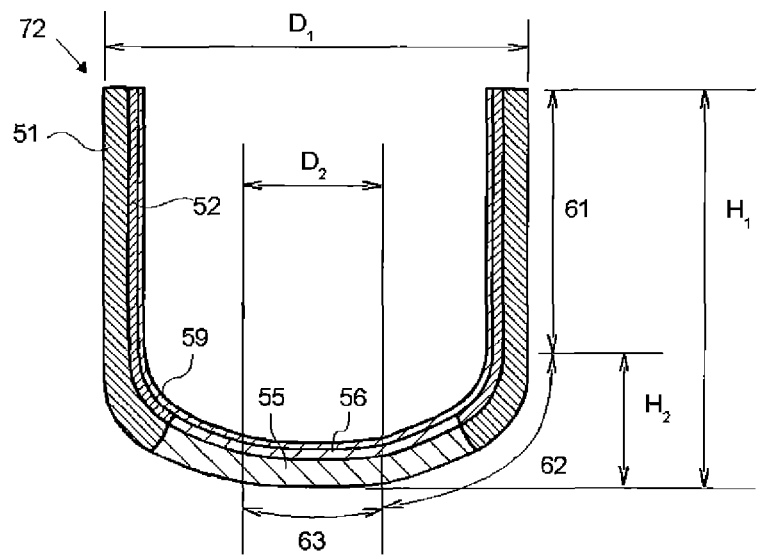
FIG. 2 is a schematic sectional view schematically depicting another example of the structure of the silica container according to the present invention.

Depending on the intended use of the silica container, a transparent silica glass layer having a thickness of 1 to 5 mm, for example, can be further formed on the inner surface of the silica container 71. In FIG. 2, a silica container 72 in which such a transparent silica glass layer is formed is depicted. A transparent silica glass layer 59 is transparent silica glass containing a small number of gaseous bubbles, is low in impurity metal element content, and is a high-purity transparent silica glass layer. Moreover, the transparent silica glass layer 59 is usually colorless and transparent.

In the transparent silica glass layer 59 of the silica container 72 depicted in FIG. 2, it is preferable to reduce impurity metal elements. By setting the concentrations of Li, Na, and K at 500 ppb by mass or less and the concentrations of Ti, Cr, Fe, Ni, Cu, Zn, Zr, Mo, W, and Pb at 100 ppb by mass or less, which are impurity metal elements, and, preferably, setting the concentrations of Li, Na, and K at 100 ppb by mass or less and the concentrations of Ti, Cr, Fe, Ni, Cu, Zn, Zr, Mo, W, and Pb at 20 ppb by mass or less, it is possible to improve the quality of a silicon single crystal which is an object to be processed.

Although the silica container 72 depicted in FIG. 2 differs from the silica container 71 depicted in FIG. 1 in the presence of the transparent silica glass layer 59, the other structure and the effects produced by the structure are the same as those of the silica container 71 of FIG. 1.

The silica container is often used under a reduced pressure at high temperature, and, in such a case, it is preferable to reduce the amount of gas that is released from the inner surfaces of the silica containers 71 and 72 depicted in FIGS. 1 and 2. If such release of gas occurs at the time of silicon melting or when a silicon single crystal is pulled upwardly, the gas is taken into single crystal silicon to be pulled upwardly and generates cavity defects called voids and pinholes in a single crystal silicon wafer. In particular, it is preferable that the amount of $H_2O$ released in the bottom portion 63 is $1 \times 10^{17}$ molecules/cm$^3$ or less. The amount of released $H_2O$ here is the value of released gas that can be measured in a vacuum at 1000° C.

Moreover, depending on the intended use of the silica containers 71 and 72, it is preferable that Ba is contained in the inner surface layer of the bottom portion 63 in concentrations of 100 to 1000 ppm by mass or Ba is applied to the inner surface of the bottom portion 63 in concentrations of 100 to 1000 μg/cm$^2$. With the presence of Ba, the inner surface of the silica container is recrystallized at a temperature of about 1500° C. at the time of silicon melting and cristobalite is generated, whereby it becomes possible to further improve resistance to silicon melt etching. By reducing the amount of melting on the surface of the inner wall of the silica container bottom portion 63, it is possible to reduce release of SiO gas, $H_2O$ gas, and $O_2$ gas into the silicon melt from the silica container bottom portion 63 and thereby reduce the amount of oxygen in a silicon crystal and reduce the generation of crystal defects (such as cavity defects). Furthermore, cristobalite has also the effect of reducing the diffusion of the impurity metal elements contained in the silica containers 71 and 72 into the silicon melt. Such an effect can also be obtained by adding or applying not only Ba but also Ca and Sr, but Ba is the most preferable. Moreover, the addition or application of Ba may be performed not only on the inner surface layer or the inner surface of the bottom portions 63 of the silica containers 71 and 72, but also on the inner surface layer or the inner surface of the curved portions 62 in addition to the inner surface layer or the inner surface of the bottom portions 63 of the silica containers 71 and 72.

Hereinafter, a method for producing a single-crystal silicon pulling silica container, the method of the present invention that can produce the above-described silica containers 71 and 72, will be described specifically.

A method for producing the silica container 71 depicted in FIG. 1 will be described with reference to FIG. 3.

Figure 3:
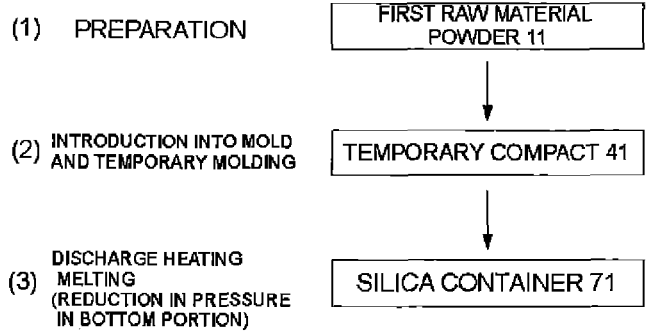
FIG. 3 is a flow diagram of the outline of an example of a method for producing a silica container according to the present invention.

First, as described in (1) of FIG. 3, as first raw material powder 11, silica powder with a particle size of 10 to 1000 μm is made. The first raw material powder 11 can be made by crushing silica stone blocks and regulating the particle size in the following way, for example, but a way to make it is not limited thereto.

First, natural silica stone blocks (naturally-produced crystal, quartz, silica stones, siliceous rocks, opal, or the like) with a diameter of about 5 to 50 mm are heated for about 1 to 10 hours in the atmosphere in the 600-to-1000° C. temperature range. Then, the natural silica stone blocks are put in water, rapidly cooled, and then taken out of the water and dried. This processing makes it possible to perform easily the next processing: crushing by a crusher or the like and particle size regulation, but the procedure may proceed to crushing processing without the heating and rapid-cooling processing.

Next, the natural silica stone blocks are crushed by a crusher or the like and are subjected to particle size regulation to adjust the particle size to preferably 10 to 1000 μm, more preferably, 50 to 500 μm, whereby natural silica stone powder is obtained. Then, the natural silica stone powder is charged into a rotary kiln formed of a silica glass tube with an inclination angle, and the inside of the kiln is made to have an atmosphere containing hydrogen chloride (HCl) or chlorine ($Cl_2$) gas, and heating is performed for about 1 to 100 hours at 800 to 1100° C., whereby processing to increase the degree of purity is performed. However, in the use of a product in which high purity is not required, the procedure may proceed to the next processing without the processing to increase the degree of purity.

The first raw material powder 11 obtained after the above-described steps is crystalline silica, but, depending on the intended purpose of the silica container, as the first raw material powder 11, amorphous silica glass powder can be used alone or by being mixed thereinto.

As described earlier, the particle size of the first raw material powder 11 is set at 10 to 1000 μm, and it is preferable to set the particle size at 50 to 500 μm. Preferably, the first raw material powder 11 has a silica purity ($SiO_2$) of 99.99% by mass or more, and, more preferably, the first raw material powder 11 has a silica purity ($SiO_2$) of 99.999% by mass or more. Moreover, with the method for producing a silica container of the present invention, even when the silica purity of the first raw material powder 11 is relatively low and is less than 99.999% by mass, a silica container to be produced can adequately prevent impurity contamination of an object to be housed in the container. Therefore, it is possible to produce a silica container at lower cost than an existing method.

Incidentally, the first raw material powder 11 may further contain Al in the range of, preferably, 5 to 30 ppm by mass. Al can be obtained by using a water or alcohol solution of, e.g., a nitrate, an acetate, a carbonate, a chloride, or the like, putting and immersing the silica powder in such a solution, and then performing drying.

After the first raw material powder 11 is made in the manner described above, as described in (2) of FIG. 3, the first raw material powder 11 is charged into a mold having rotational symmetry, the mold with a bottom portion having holes for pressure reduction, and is temporarily molded into a predetermined shape corresponding to the inner wall of the mold concurrently with the rotation the mold, whereby a temporary compact 41 is obtained. In FIG. 5, a sectional view of the outline of the mold for temporarily molding the first raw material powder 11 is depicted. A mold 101 used in the present invention is formed of, for example, a member made of heat-resistant ceramic such as graphite or alumina, has rotational symmetry, and can be rotated by a motor (not shown) for rotating a mold. Moreover, in an inner wall 102 of the mold 101, holes 103 for pressure reduction are distributed and formed in at least the bottom portion. The holes 103 for pressure reduction may be formed also in the curved portion. The holes 103 for pressure reduction lead to a passage 104 for pressure reduction. Furthermore, a passage 105 for pressure reduction is formed through a rotating shaft 106 for rotating the mold 101, which makes it possible to perform vacuuming through this passage.

Figure 6:
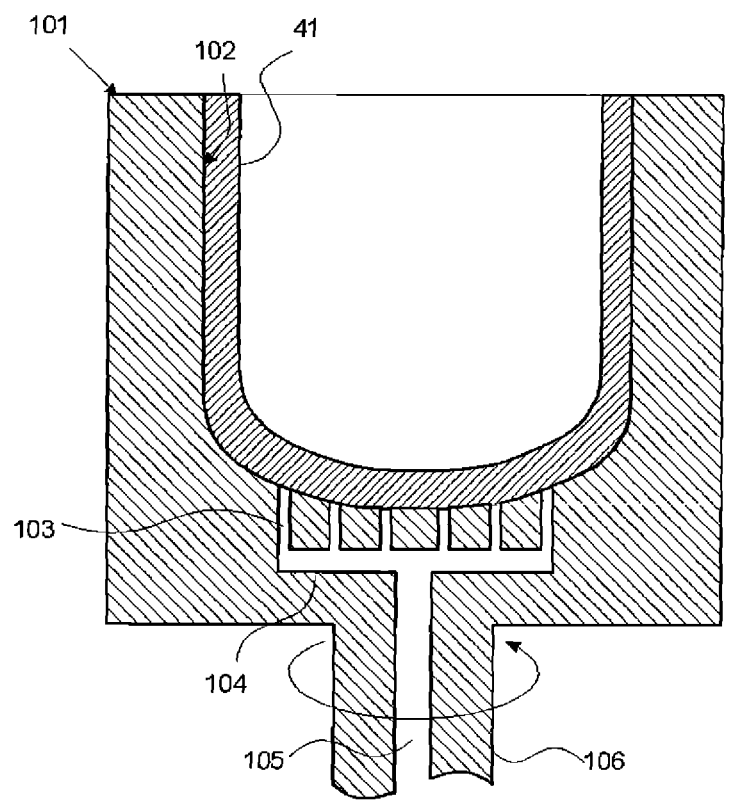
FIG. 6 is a schematic sectional view schematically depicting an example of a step of forming a temporary compact in the method for producing a silica container according to the present invention.

The first raw material powder 11 is introduced into the inner wall 102 of this mold 101, and the first raw material powder 11 is temporarily molded into a predetermined shape corresponding to the inner wall 102 of the mold 101, whereby the temporary compact 41 is obtained (refer to FIG. 6). Specifically, the first raw material powder 11 is gradually charged into the inner wall 102 of the mold 101 concurrently with the rotation of the mold 101 and is molded into the shape of a container by using a centrifugal force. Moreover, the thickness of the temporary compact 41 may be adjusted to a predetermined thickness by bringing a plate-like inner mold (not shown) into contact with the rotating powder from inside. Furthermore, the method for supplying the first raw material powder 11 to the mold 101 is not limited to a particular method; for example, a hopper provided with a stirring screw and a metering feeder can be used. In this case, the first raw material powder 11 with which the hopper is filled is stirred with the stirring screw and is supplied concurrently with an adjustment of the supplied amount by the metering feeder.

Figure 7:
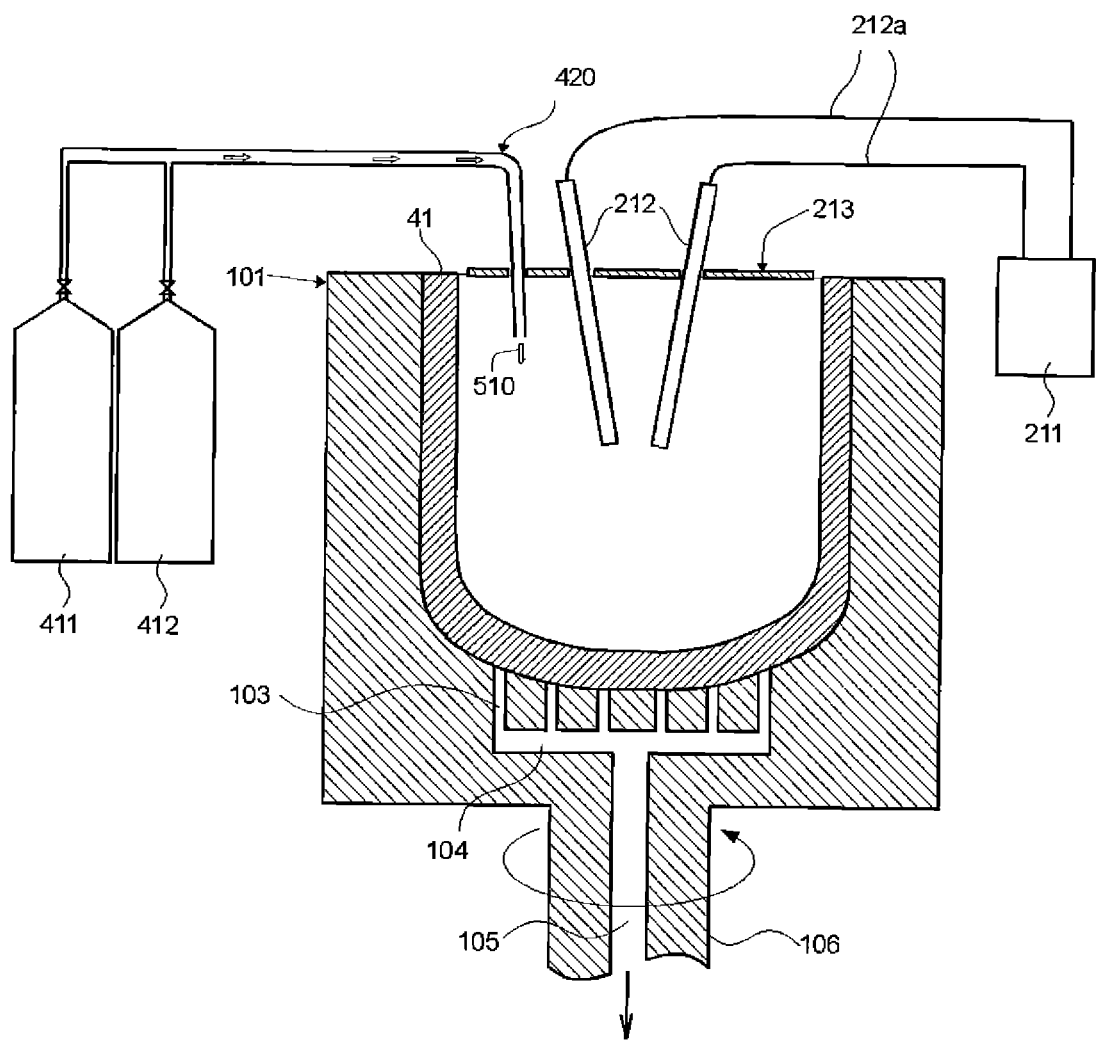
FIG. 7 is a schematic sectional view schematically depicting part (before discharge heating melting) of an example of a discharge heating step in the method for producing a silica container according to the present invention.
Figure 8:
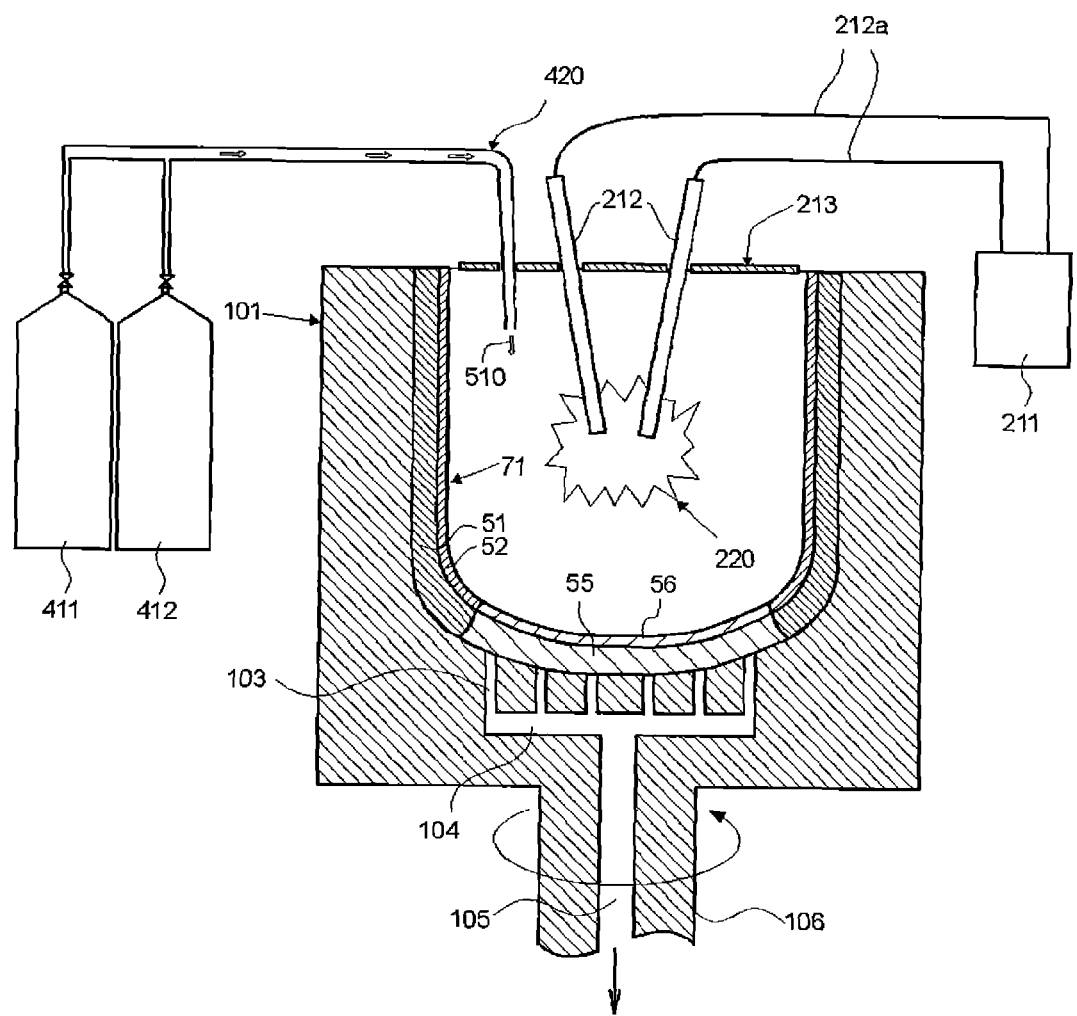
FIG. 8 is a schematic sectional view schematically depicting part (during discharge heating melting) of the example of the discharge heating step in the method for producing a silica container according to the present invention.

Next, as described in (3) of FIG. 3, carbon electrodes are placed in the temporary compact 41, and the temporary compact 41 is heated and melted by the discharge heating melting method concurrently with a supply of gas containing hydrogen. This discharge heating melting step is performed concurrently with degassing by reducing the pressure in the bottom portion of the temporary compact 41 from the outside of the mold 101. Specifically, as depicted in FIGS. 7 and 8, by reducing the pressure with the holes 103 for pressure reduction, the holes 103 formed in at least the bottom portion of the mold 101, degassing of the temporary compact 41 is performed by reducing the pressure thereof from the outside of the mold 102, and the temporary compact 41 is heated from inside by the discharge heating melting method. In this way, the silica container 71 can be made. At this time, as a result of discharge heating melting and degassing in an atmosphere containing hydrogen, the OH group concentration in the bottom portion becomes lower than the OH group concentration in the straight body portion. In particular, it is possible to set the OH group concentration in the straight body portion 61 of the silica container 71 at 30 to 300 ppm by mass, the OH group concentration in the bottom portion 63 at 30 ppm by mass or less, and the difference in the OH group concentration between the straight body portion 61 and the bottom portion 63 at 30 ppm by mass or more. If this discharge heating melting is performed in the atmosphere, for example, not in an atmosphere containing hydrogen, even when degassing is performed, the OH group concentration in the bottom portion 63 becomes only about 50 ppm by mass, and it is impossible to set the OH group concentration in the bottom portion 63 at 30 ppm by mass or less. Moreover, at this time, in the straight body portion of the silica container 71, an outer portion can be formed of a sintered body, an inner portion of the silica container 71 can be formed of a molten glass body, and, in the bottom portion, the whole portion thereof can be made of translucent silica glass or transparent silica glass containing substantially no gaseous bubble.

An apparatus for making the silica container 71 is formed of, in addition to the above-described rotatable mold 101 having rotation axis symmetry, a rotary motor (not shown), carbon electrodes (carbon electrodes) 212 which become a heat source of discharge heating melting (also called arc melting and arc discharge melting), electric wires 212a, a high-voltage power supply unit 211, a lid 213, and the like. Furthermore, the apparatus is provided with components for adjusting the atmospheric gas that is supplied from the inside of the temporary compact 41, for example, a hydrogen gas supply cylinder 411, an inert gas supply cylinder 412, a mixed gas supply pipe 420, and the like.

Incidentally, this apparatus can also be used continuously when a layer made of transparent silica glass is further formed on a surface portion of the silica container 71 as will be described later.

As a procedure for melting and sintering the temporary compact 41, it is preferable to supply gas containing hydrogen from the inside of the temporary compact 41 before applying voltage between the carbon electrodes 212. Specifically, as depicted in FIG. 7, hydrogen gas is supplied from the hydrogen gas supply cylinder 411, inert gas (for example, nitrogen ($N_2$), argon (Ar), or helium (He)) is supplied from the inert gas supply cylinder 412, and these gases are mixed and supplied from the inside of the temporary compact 41 through the mixed gas supply pipe 420. Incidentally, an arrow outline with a blank inside, the arrow identified with character 510, indicates the flow of the mixed gas.

Next, in a state in which the mixed gas is continuously supplied in the manner described above, while the mold 101 having the temporary compact 41 inside is rotated at a constant rate, a vacuum pump for degassing (not shown) is started to reduce the pressure from the outside of the bottom portion of the temporary compact 41 through the holes 103 for pressure reduction and the passages 104 and 105 for pressure reduction, and the application of voltage between the carbon electrodes 212 is started.

When arc discharge (identified with character 220 in the drawing) between the carbon electrodes 212 is started, an inner surface part of the temporary compact 41 reaches a silica powder melting temperature range (which is estimated to be about 1800 to 2000° C.), and melting starts from an outermost surface layer part. When the outermost surface layer part is melted, the degree of reduced pressure of vacuuming by the degassing vacuum pump is increased (the pressure is suddenly lowered), a change into a molten silica glass layer progresses from the inside to the outside concurrently with degassing of dissolved gas such as water and oxygen contained in the first raw material powder 11.

Heating by the application of voltage is continuously performed until about half of the inside of the entire thickness of the straight body portion of the temporary compact 41 is melted and becomes transparent to translucent silica glass and about half of the remaining outside becomes sintered opaque silica. Moreover, at the same time, the pressure is continuously reduced and gas is continuously exhausted by heating and a vacuum pump until the bottom portion of the temporary compact 41 becomes transparent to translucent silica glass in the entire thickness thereof.

To reduce the dissolved gas in the melted silica glass, as described above, in this step, the gas containing hydrogen is used as the atmospheric gas. As the gas containing hydrogen, for example, mixed gas of hydrogen gas and inert gas such as nitrogen gas ($N_2$), argon (Ar), or helium (He) can be used. Preferably, the content ratio of the hydrogen gas ($H_2$) is set at 1% by volume or more and, more preferably, at 1 to 10% by volume. The reason is as follows: for example, the oxygen gas ($O_2$) which is difficult to be degassed reacts with hydrogen to form water ($H_2O$), and, since the diffusion constant of a water molecule is larger than that of an oxygen molecule, the water molecule is considered to be easily released to the outside of the outer layer. Moreover, since the molecule radius of hydrogen gas ($H_2$) is small and the hydrogen gas ($H_2$) has a large diffusion constant, even when the hydrogen gas ($H_2$) is contained in the atmospheric gas, the hydrogen gas ($H_2$) is easily released to the outside of the outer layer.

With the steps described above, the silica container 71 (refer to FIG. 1) is produced. Moreover, when needed, it can also be formed as the silica container 72 (refer to FIG. 2) which is obtained by further forming a transparent silica glass layer containing substantially no gaseous bubble in an inner surface portion of the silica container 71. This method will be described with reference to FIG. 4.

Also in this method, as is the case with the steps 1 to 3 described in (1) to (3) of FIG. 3 described above, the silica container 71 is formed by the steps of forming the silica container 71 (refer to FIGS. 4 (1) to (3)). In addition to this, as second raw material powder 12, silica powder with a particle size of 10 to 1000 μm, the silica powder with a higher purity than the first raw material powder, is made. The method for making the second raw material powder may be the same as the method for making the above-described first raw material powder except that the purity of the second raw material powder is made to be higher than that of the first raw material powder. Moreover, as the material of the second raw material powder 12, natural quartz powder, natural crystal powder, synthetic cristobalite powder, or synthetic silica glass powder, which was subjected to processing to increase the degree of purity, can be used. To reduce the gaseous bubble amount in the transparent silica glass layer 59, crystalline silica powder is preferable, or, to obtain an inner layer made of high-purity transparent silica glass, synthetic powder is desirable. It is more preferable to set the particle size of the second raw material powder 12 at 100 to 500 μm. It is preferable that the second raw material powder 12 contains a silica component ($SiO_2$) at a purity of 99.9999% by mass or more. More specifically, it is preferable that the above-described purity is achieved and, at the same time, each of alkali metal elements Li, Na, and K is 500 ppb by mass or less, which is more preferably 100 ppb by mass or less. Moreover, it is preferable that the above-described purity is achieved and, at the same time, each of Ti, Cr, Fe, Ni, Cu, Zn, Zr, Mo, W, and Pb is 100 ppb by mass or less, which is more preferably set to 20 ppb by mass or less.

Next, as described in (4) of FIG. 4, at least after the discharge heating melting step (FIG. 4 (3)) performed on the temporary compact 41, the second raw material powder 12 is heated and melted by the discharge heating melting method while being spread from an upper part of the silica container 71, whereby the transparent silica glass layer 59 containing substantially no gaseous bubble is further formed on the inner surface of the silica container 71. The basic method for forming the transparent silica glass layer 59 by this step is similar to the descriptions of Patent Literature 1 and Patent Literature 2, for example.

Figure 9:
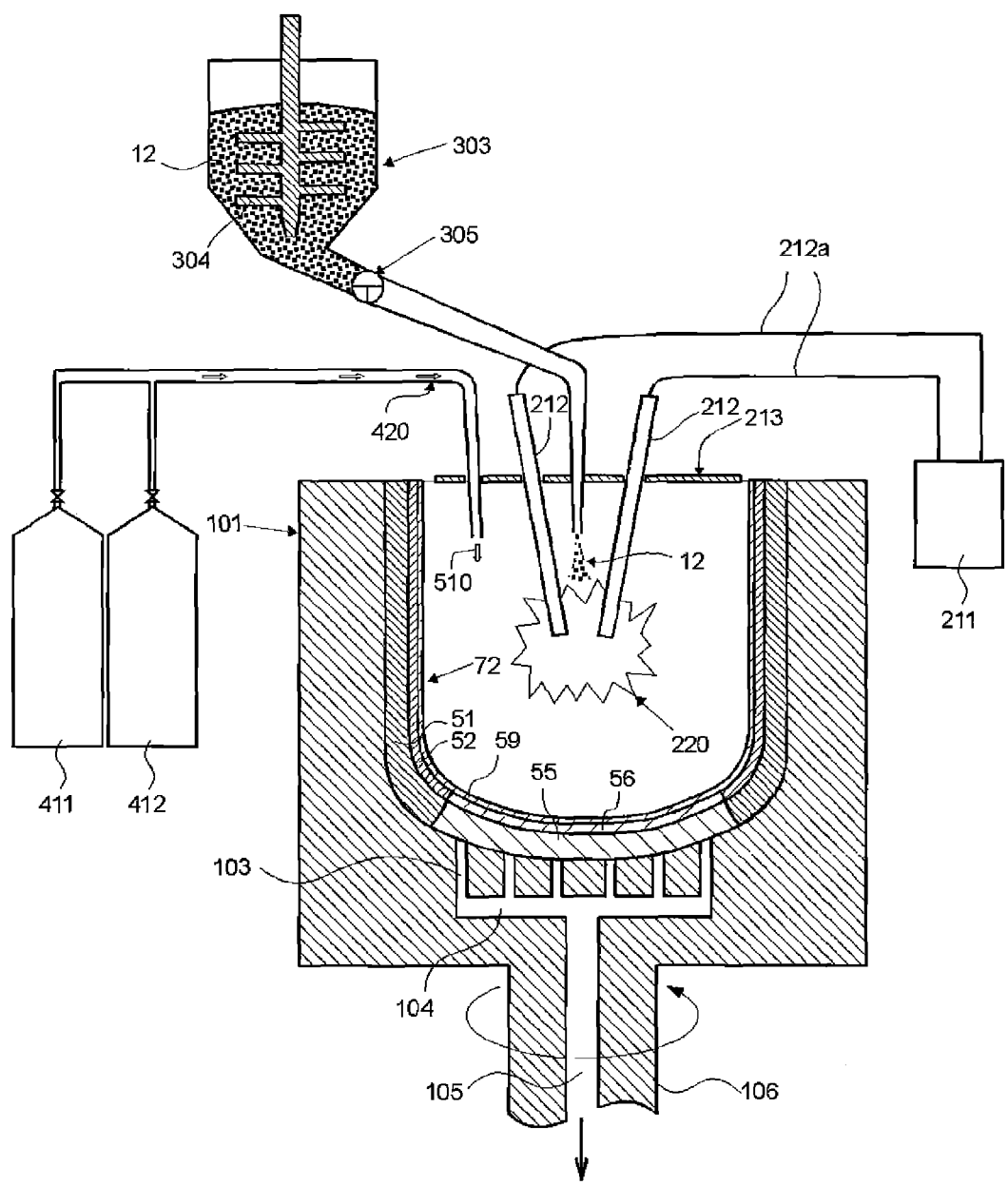
FIG. 9 is a schematic sectional view schematically depicting an example of a step of forming a transparent silica glass layer on the innermost surface of a silica container in the method for producing a silica container according to the present invention.

This step will be described with reference to FIG. 9. An apparatus for further forming the transparent silica glass layer 59 in the surface portion of the silica container 71 is almost the same as that used in the previous step and is formed of a rotatable mold 101 having rotation axis symmetry, the mold 101 in which the silica container 71 is placed, a rotary motor (not shown), a raw material powder hopper 303 containing the second raw material powder 12, a stirring screw 304, a metering feeder 305, carbon electrodes 212 which become a heat source of discharge heating melting, electric wires 212a, a high-voltage power supply unit 211, a lid 213, and the like. Moreover, when the atmospheric gas is adjusted, as is the case with the discharge heating melting step (FIG. 4 (3)), the apparatus may be further provided with a hydrogen gas supply cylinder 411, an inert gas supply cylinder 412, a mixed gas supply pipe 420, and the like.

As the method for forming the transparent silica glass layer 59, first, the mold 101 is set at a predetermined rotation speed, high voltage is gradually applied from the high-voltage power supply unit 211 and, at the same time, the second raw material powder 12 is gradually spread from the raw material hopper 303 from an upper part of the silica container 71. At this time, since discharge has already started between the carbon electrodes 212 and the inside of the silica container 71 is in the silica powder melting temperature range (which is estimated to be about 1800 to 2000° C.), the spread second raw material powder 12 becomes silica molten particles and begins to adhere to the inner surface of the silica container 71. The carbon electrodes 212, a raw material powder input port, and the lid 213 that are placed in an upper opening of the silica container 71 are mechanisms whose positions can be changed to some extent with respect to the silica container 71, and, by changing these positions, it is possible to form the transparent silica glass layer 59 on the entire inner surface of the silica container 71 in uniform thickness.

The atmospheric gas inside the silica container 71 during arc discharge melting has inert gas such as nitrogen gas ($N_2$), argon (Ar), and helium (He) as the main ingredient to reduce the wearing out of the carbon electrodes, and, by using a mixed atmosphere containing 1 to 10% by volume of hydrogen gas ($H_2$), it is possible to obtain the transparent silica glass layer 59 which is a transparent silica glass layer with fewer gaseous bubbles.

If carbon fine particles which are generated at the time of arc discharge melting and carbon monoxide (CO) and carbon dioxide ($CO_2$) which are compounds made up of carbon and oxygen remain in the transparent silica glass layer 59, they are regenerated as impurities when single crystal silicon is pulled upwardly and become one cause of a reduction in the quality of the silicon. To suppress this, it is preferable to ventilate the inside of the silica container during melting appropriately by exhausting the gas in the container at a constant flow rate while supplying clean atmospheric gas at a constant flow rate from the outside of the silica container.

Depending on the intended use of a silica container to be produced, as the second raw material powder 12 for forming the transparent silica glass layer 59, silica powder subjected to processing to increase the degree of purity or silica powder containing a particular element in a predetermined concentration can be used. For example, when barium (Ba), which is an alkaline earth metal element, is added to the raw material powder as an etching-resisting agent, the transparent silica glass layer 59 contains these elements. Then, when the silica container is used at 1300 to 1600° C., the transparent silica glass layer 59 is recrystallized and forms a cristobalite layer, making it possible to prevent diffusion contamination of an object to be processed in the container by the impurity metal elements contained in the container and reduce etching of the silica glass on the surface of the transparent silica glass layer 59. This processing may be performed depending on the intended use of the silica container and the necessity. In particular, the object of the present invention makes it preferable that the inner surface layer of the silica container bottom portion 63 or the inner surface layer of the bottom portion 63 and the curved portion 62 contains (is doped with) Ba in the range of 100 to 1000 ppm by mass.

To improve the resistance of the silica container bottom portion 63 to etching by the silicon melt, a barium compound solution may also be applied to the inner surface of the silica container bottom portion 63 or the inner surface of the bottom portion 63 and the curved portion 62 in such a way that the Ba concentration is set at 100 to 1000 μg/cm$^2$ and be dried. This application of Ba is performed by dissolving nitrate, acetate, carbonate, chloride, or the like in an aqueous or alcohol solution and applying such a solution to the inner surface of the silica container in a predetermined position with a brush or spray coating, for example. After the application, drying is performed to fix Ba. As described earlier, the application of Ba produces the effect of suppressing etching of the inner surface of the silica container by the silicon melt and reducing impurity metal elemental contamination of the silicon melt.

Examples

Hereinafter, the present invention will be described more specifically with examples and comparative examples of the present invention, but the present invention is not limited to these examples.

Example 1

A single-crystal silicon pulling silica container was produced in accordance with the steps (1) to (3) described in FIG. 3. A natural quartz powder that has silica ($SiO_2$) purity of 99.999% by mass or more and a particle size of 50 to 500 μm and that was doped with 10 ppm by mass of Al was prepared as the first raw material powder 11. As the atmospheric gas at the time of melting of the temporary compact 41, dried mixed gas of 95% by volume of $N_2$ and 5% by volume of $H_2$ was used. The other conditions are listed in Table 1.

Example 2

A silica container was produced in the same manner as in Example 1, but, as the atmospheric gas at the time of melting of the temporary compact 41, dried mixed gas of 99% by volume of $N_2$ and 1% by volume of $H_2$ was used. Moreover, in a final step, a barium nitrate solution was applied to the whole of the bottom portion 63 of the silica container and an inner surface part of part of the curved portion 62 and was dried, and the amount of Ba was set at 500 (μg/cm$^2$). The other conditions are listed in Table 1.

Example 3

A single-crystal silicon pulling silica container was produced in accordance with the steps (1) to (4) described in FIG. 4. As the first raw material powder 11, a natural quartz powder that has silica ($SiO_2$) purity of 99.999% by mass or more and a particle size of 50 to 500 μm and that was doped with 30 ppm by mass of Al was used. As the second raw material powder 12, a high-purity synthetic cristobalite powder that has silica purity of 99.9999% by mass or more and a particle size of 100 to 300 μm was used. As the atmospheric gas at the time of melting of the temporary compact 41 and the atmospheric gas at the time of melting of the second raw material powder 12, dried mixed gas of 95% by volume of $N_2$ and 5% by volume of $H_2$ was used. The other conditions are listed in Table 2.

Example 4

A single-crystal silicon pulling silica container was produced in accordance with the steps (1) to (4) described in FIG. 4. The first raw material powder 11 doped with Al, the first raw material powder 11 similar to that of Example 3, was prepared. Moreover, as the second raw material powder 12, two types of powder: the powder doped with Ba and the powder that was not doped with Ba were prepared. Furthermore, as the atmospheric gas at the time of melting of the temporary compact 41 and the atmospheric gas at the time of melting of the second raw material powder 12, dried mixed gas of 99% by volume of $N_2$ and 1% by volume of $H_2$ was used. A Ba-doped transparent silica glass layer was formed on the whole of the bottom portion 63 of the silica container and only in an inner surface portion of part of the curved portion 62, and the concentration was set at 500 ppm by mass. The other conditions are listed in Table 2.

Example 5

A silica container was produced in the same manner as in Example 1, but, in a final step, a barium nitrate solution was applied to the whole of the bottom portion 63 of the silica container and an inner surface part of part of the curved portion 62 and was dried, and the amount of Ba was set at 100 μg/cm$^2$. The other conditions are listed in Table 3.

Example 6

A silica container was produced in the same manner as in Example 1, but, in a final step, a barium nitrate solution was applied to the whole of the bottom portion 63 of the silica container and an inner surface part of part of the curved portion 62 and was dried, and the amount of Ba was set at 1000 μg/cm$^2$. The other conditions are listed in Table 3.

Example 7

A silica container was produced in the same manner as in Example 3, but, as the first raw material powder 11, a natural quartz powder with Al content of 2 ppm by mass was used. The first raw material powder 11 was not intentionally doped with Al. The other conditions are listed in Table 4.

Example 8

A silica container was produced in the same manner as in Example 4, but, as the first raw material powder 11, a natural quartz powder with Al content of 2 ppm by mass was used, and the first raw material powder 11 was not intentionally doped with Al. Moreover, as the second raw material powder 12, only one type of powder: the powder that was not doped with Ba was used. Furthermore, in a final step, a barium nitrate solution was applied to the whole of the bottom portion 63 of the silica container and an inner surface part of part of the curved portion 62 and was dried, and the amount of Ba was set at 250 μg/cm$^2$. The other conditions are listed in Table 4.

Example 9

A silica container was produced in the same manner as in Example 3, but, as the atmospheric gas at the time of melting of the temporary compact 41 and the atmospheric gas at the time of melting of the second raw material powder 12, dried mixed gas of 95% by volume of He and 5% by volume of $H_2$ was used, whereby the amount of OH in the bottom portion 63 was particularly reduced. The other conditions are listed in Table 5.

Example 10

A silica container was produced in the same manner as in Example 3, but, as the atmospheric gas at the time of melting of the temporary compact 41 and the atmospheric gas at the time of melting of the second raw material powder 12, dried mixed gas of 90% by volume of He and 10% by volume of $H_2$ was used, whereby the amount of OH in the bottom portion 63 was particularly reduced. The other conditions are listed in Table 5.

Comparative Example 1

As a first raw material powder, a natural quartz powder that has silica purity of 99.999% by mass or more and a particle size of 100 to 300 μm was used. Melting of a temporary compact was performed by a reduced-pressure arc melting method in an air atmosphere with no humidity control. However, decompression exhaust holes of a graphite mold were disposed all over the straight body portion 61 from the bottom portion 63. A barium nitrate solution was applied to the entire inner surface of the silica container and was dried. The amount of applied barium was set at 500 ($\mu g/cm^2$).

Comparative Example 2

A First raw material powder that is identical to that of Example 3 except that the first raw material powder was not intentionally doped with Al and the particle size was set at 100 to 300 μm was used, and the same second raw material powder as that of Example 3 was used. Melting of a temporary compact was performed by an atmospheric arc melting method in an air atmosphere with no humidity control, and the formation of an inner layer was performed by an atmospheric arc melting method by the spreading of the second raw material powder.

Comparative Example 3

A silica container was produced in the same manner as in Comparative Example 1, but, as a first raw material powder, a natural quartz powder that has silica purity of 99.999% by mass or more and a particle size of 50 to 500 μm was used. Moreover, barium was not applied to the inner surface of the silica container. The other conditions are listed in Table 7.

Comparative Example 4

A silica container was produced in the same manner as in Comparative Example 2, but, as a first raw material powder, a natural quartz powder that has silica purity of 99.999% by mass or more and a particle size of 50 to 500 μm was used. Moreover, as an atmosphere at the time of melting of a temporary compact and the formation of an inner layer, humidified air was used, whereby the amount of OH group in the silica container was increased. The other conditions are listed in Table V.

[Evaluation Method in the Examples and the Comparative Examples]

The physical property and characteristic evaluations of the raw material powder used and the gases and the produced silica containers in the examples and comparative examples were performed in the following manner.

The Method for Measuring the Particle Size of Each Raw Material Powder:

Observation of the two-dimensional shape and measurement of the area of each raw material powder were performed by an optical microscope or an electron microscope. Then, on the assumption that the shape of a particle was a perfect circle, the diameter was calculated and determined based on the value of the area thereof. This method was repeatedly performed statistically, and the obtained values are listed in Tables 1 to 7 as the values in the particle size range (99% by mass or more of each raw material powder is included in this range).

Measurement of the Layer Thickness of a Straight Body Portion:

The thickness of a layer was determined by measuring the cross section of a straight body portion in a ½ part of the entire height of a silica container by using a scale.

Measurement of the OH Group Concentration:

Silica glass samples were cut from transparent portions of the straight bodies and the bottom portions of the silica containers, the transparent portions containing no gaseous bubble, and measurement was performed by the infrared absorption spectrophotometry. The conversion into the OH group concentration was performed in accordance with the following document: Dodd, D. M. and Fraser, D. B. (1966) Optical determination of OH in fused silica. Journal of Applied Physics, vol. 37, P. 3911.

Measurement of the Amount of Released Water ($H_2O$):

From transparent portions of the bottom portions of the silica containers, the transparent portions containing no gaseous bubble, measurement samples, each being 10 mm×50 mm×1 mm thick, the measurement samples with both faces polished to a mirror-smooth state, were made and placed in a vacuum chamber, and the amount of released gas in a vacuum at 1000° C. was measured. When the amount of released gas was small, a plurality of measurement samples were put into a sample chamber of a gas measuring instrument at a time to increase the gas detection sensitivity. The details of the measurement method was based on the following document: Nasu, S. et al. (1990) "Gas release of various kinds of vitreous silica", Journal of Illuminating Engineering Institute of Japan, vol. 74, No. 9, pp. 595-600.

Impurity Metal Element Concentration Analysis of a Bottom Portion Transparent Layer and an Impurity Level:

When an impurity metal element concentration was relatively low (when the glass was high-purity glass), analysis was conducted by plasma emission spectroscopy (ICP-AES) or plasma mass spectrometry (ICP-MS), and, when an impurity metal element concentration was relatively high (when the glass was low-purity glass), analysis was conducted by atomic absorption spectroscopy (AAS). As a result, the following evaluations were made according to the total concentration of 13 elements: alkali metal elements Li, Na, and K and transition metal elements Ti, Cr, Fe, Ni, Cu, Zn, Zr, Mo, W, and Pb.

| less than 0.5 ppm by mass | ○ (good) |
| 0.5 to 5 ppm by mass | Δ (slightly poor) |
| 5 ppm by mass or more | × (poor) |

Incidentally, in Example 1, five samples were obtained from the inner transparent layer of the bottom portion of the silica container, and, in Example 3 and Comparative Example 2, five samples were obtained from the inner layer which is a transparent silica glass layer additionally formed on an inner surface portion of the bottom portion. Each concentration value is the average value of the five samples.

Evaluation of Continuous Pulling (Multiple Pulling Operations) of Single Crystal Silicon:

Metal polysilicon having purity of 99.99999% by mass was charged into the produced silica container, the temperature was raised to turn the metal polysilicon into silicon melt, pulling of single crystal silicon was repeatedly performed three times (multiple pulling operations), and evaluations were made as the success rate of the growth of a single crystal. The pulling conditions were as follows: the inside of a pulling apparatus (a CZ apparatus) was put under an atmosphere containing 100% of argon (Ar) gas, the pulling rate was set at 1 mm/minute, the revolutions per minute was set at 10 rpm, the measurements of single crystal silicon was 300 mm in diameter and 600 mm in length, and the hour of operation of 1 batch was set at about 50 hours. A classification of the success ratio of three repeated single crystal growth operations was made as follows.

| 3 times | ○ (good) |
|---|---|
| 2 times | Δ (slightly poor) |
| 1 time | x (poor) |

Evaluations of Voids and Pinholes:

In the above-described continuous pulling of single crystal silicon, from an arbitrary area of the first single crystal silicon after completion of multiple pulling operations of each single crystal silicon, 200 silicon wafers, each being 300 mm in diameter and 200 μm in thickness, the silicon wafers with both faces polished to a mirror-smooth state, were made. Then, the number of voids and pinholes that were present in both faces of each silicon wafer were measured by a particle detector and numerical processing was statistically performed to determine the number of wafers containing no defect, the wafers of the 200 silicon wafers. As a result, the following evaluations were made according to the number of silicon wafers from which neither void nor pinhole was detected. However, the diameter of a detectable void and a detectable pinhole was 50 μm or more.

| The number of defect-free silicon wafers | |
|---|---|
| 200 | ○ (good) |
| 199 to 198 | Δ (slightly poor) |
| 197 or less | x (poor) |

The production conditions of the silica containers produced in Examples 1 to 10 and Comparative Examples 1 to 4, the measured physical property values, and the evaluations results are combined and listed in the following Tables 1 to 8. In Table 8, impurity analysis values of the inner transparent layers of the bottom portions of Examples 1 and 3 and Comparative Example 2 are listed.

TABLE 1

| Example number | | Example 1 | Example 2 |
|---|---|---|---|
| First raw material powder | | Natural quartz powder with particle size of 50 to 500 μm | Natural quartz powder with particle size of 50 to 500 μm |
| Second raw material powder | | None | None |
| Method for molding a temporary compact | | Rotational molding method in graphite mold | Rotational molding method in graphite mold |
| Method for melting a temporary compact | | Reduced-pressure arc discharge melting method | Reduced-pressure arc discharge melting method |
| Atmospheric gas for melting a temporary compact | | $N_2$ 95% by volume, $H_2$ 5% by volume | $N_2$ 99% by volume, $H_2$ 1% by volume |
| Atmospheric gas for melting additional layer | | — | — |
| Atmospheric gas at the time of cooling | | $N_2$ 80% by volume, $O_2$ 20% by volume | $N_2$ 80% by volume, $O_2$ 20% by volume |
| Physical properties of a straight body portion | Color tone | Outside white and opaque/ inside colorless and transparent | Outside white and opaque/ inside colorless and transparent |
| | Outer diameter, height, thickness (mm) | Outer diameter 800 × Height 360 × Thickness 16 | Outer diameter 800 × Height 360 × Thickness 16 |
| | OH group (ppm by mass) | 40 to 50 | 70 to 80 |
| | Al (ppm by mass) | 10 | 10 |
| Physical properties of a bottom portion | Color tone | colorless and transparent to translucent | colorless and transparent to translucent |
| | Thickness (mm) | 17 | 17 |
| | OH group (ppm by mass) | 5 | 10 |
| | Al (ppm by mass) | 10 | 10 |
| | $H_2O$ release (molecules/cm$^3$) | $5 \times 10^{16}$ | $9 \times 10^{16}$ |
| | Ba in an inner surface (μg/cm$^2$) | None | 500 |
| Evaluations | Single crystal multiple pulling operations | Δ | ○ |
| | Impurity level of a transparent layer | Δ | Δ |
| | Voids and pinholes | Δ | ○ |

TABLE 2

| Example number | | Example 3 | Example 4 |
|---|---|---|---|
| First raw material powder | | Natural quartz powder with particle size of 50 to 500 μm | Natural quartz powder with particle size of 50 to 500 μm |
| Second raw material powder | | Synthetic cristobalite powder with particle size of 100 to 300 μm | Synthetic cristobalite powder with particle size of 100 to 300 μm |
| Method for molding a temporary compact | | Rotational molding method in graphite mold | Rotational molding method in graphite mold |
| Method for melting a temporary compact | | Reduced-pressure arc discharge melting method | Reduced-pressure arc discharge melting method |
| Atmospheric gas for melting a temporary compact | | $N_2$ 95% by volume, $H_2$ 5% by volume | $N_2$ 99% by volume, $H_2$ 1% by volume |
| Atmospheric gas for melting additional layer | | $N_2$ 95% by volume, $H_2$ 5% by volume | $N_2$ 99% by volume, $H_2$ 1% by volume |
| Atmospheric gas at the time of cooling | | $N_2$ 80% by volume, $O_2$ 20% by volume | $N_2$ 80% by volume, $O_2$ 20% by volume |
| Physical properties of a straight body portion | Color tone | Outside white and opaque/inside colorless and transparent | Outside white and opaque/inside colorless and transparent |
| | Outer diameter, height, thickness (mm) | Outer diameter 800 × Height 360 × Thickness 17 | Outer diameter 800 × Height 360 × Thickness 17 |
| | OH group (ppm by mass) | 50 to 60 | 70 to 80 |
| | Al (ppm by mass) | 30 | 30 |
| Physical properties of a bottom portion | Color tone | colorless and transparent to translucent | colorless and transparent to translucent |
| | Thickness (mm) | 18 | 18 |
| | OH group (ppm by mass) | 5 | 10 |
| | Al (ppm by mass) | 30 | 30 |
| | $H_2O$ release (molecules/cm$^3$) | $6 \times 10^{16}$ | $8 \times 10^{16}$ |
| | Ba in an inner surface layer (ppm by mass) | None | 500 |
| Evaluations | Single crystal multiple pulling operations | Δ | ○ |
| | Impurity level of a transparent layer | ○ | ○ |
| | Voids and pinholes | ○ | ○ |

TABLE 3

| Example number | | Example 5 | Example 6 |
|---|---|---|---|
| First raw material powder | | Natural quartz powder with, particle size of 50 to 500 μm | Natural quartz powder with particle size of 50 to 500 μm |
| Second raw material powder | | None | None |
| Method for molding a temporary compact | | Rotational molding method in graphite mold | Rotational molding method in graphite mold |
| Method for melting a temporary compact | | Reduced-pressure arc discharge melting method | Reduced-pressure arc discharge melting method |
| Atmospheric gas for melting a temporary compact | | $N_2$ 95% by volume, $H_2$ 5% by volume | $N_2$ 95% by volume, $H_2$ 5% by volume |
| Atmospheric gas for melting additional layer | | — | — |
| Atmospheric gas at the time of cooling | | $N_2$ 80% by volume, $O_2$ 20% by volume | $N_2$ 80% by volume, $O_2$ 20% by volume |
| Physical properties of a straight body portion | Color tone | Outside white and opaque/inside colorless and transparent | Outside white and opaque/inside colorless and transparent |
| | Outer diameter, height, thickness (mm) | Outer diameter 800 × Height 360 × Thickness 16 | Outer diameter 800 × Height 360 × Thickness 16 |
| | OH group (ppm by mass) | 40 to 50 | 40 to 50 |
| | Al (ppm by mass) | 10 | 10 |

TABLE 3-continued

| Example number | | Example 5 | Example 6 |
|---|---|---|---|
| Physical properties of a bottom portion | Color tone | colorless and transparent to translucent | colorless and transparent to translucent |
| | Thickness (mm) | 17 | 17 |
| | OH group (ppm by mass) | 7 | 6 |
| | Al (ppm by mass) | 10 | 10 |
| | $H_2O$ release (molecules/$cm^3$) | $5 \times 10^{16}$ | $5 \times 10^{16}$ |
| | Ba in an inner surface (μg/$cm^2$) | 100 | 1000 |
| Evaluations | Single crystal multiple pulling operations | Δ | ○ |
| | Impurity level of a transparent layer | Δ | ○ |
| | Voids and pinholes | ○ | Δ |

TABLE 4

| Example number | | Example 7 | Example 8 |
|---|---|---|---|
| First raw material powder | | Natural quartz powder with particle size of 50 to 500 μm | Natural quartz powder with particle size of 50 to 500 μm |
| Second raw material powder | | Synthetic cristobalite powder with particle size of 100 to 300 μm | Synthetic cristobalite powder with particle size of 100 to 300 μm |
| Method for molding a temporary compact | | Rotational molding method in graphite mold | Rotational molding method in graphite mold |
| Method for melting a temporary compact | | Reduced-pressure arc discharge melting method | Reduced-pressure arc discharge melting method |
| Atmospheric gas for melting a temporary compact | | $N_2$ 95% by volume, $H_2$ 5% by volume | $N_2$ 99% by volume, $H_2$ 1% by volume |
| Atmospheric gas for melting additional layer | | $N_2$ 95% by volume, $H_2$ 5% by volume | $N_2$ 99% by volume, $H_2$ 1% by volume |
| Atmospheric gas at the time of cooling | | $N_2$ 80% by volume, $O_2$ 20% by volume | $N_2$ 80% by volume, $O_2$ 20% by volume |
| Physical properties of a straight body portion | Color tone | Outside white and opaque/inside colorless and transparent | Outside white and opaque/inside colorless and transparent |
| | Outer diameter, height, thickness (mm) | Outer diameter 800 × Height 360 × Thickness 17 | Outer diameter 800 × Height 360 × Thickness 17 |
| | OH group (ppm by mass) | 50 to 60 | 70 to 80 |
| | Al (ppm by mass) | 2 | 2 |
| Physical properties of a bottom portion | Color tone | colorless and transparent to translucent | colorless and transparent to translucent |
| | Thickness (mm) | 18 | 18 |
| | OH group (ppm by mass) | 10 | 15 |
| | Al (ppm by mass) | 2 | 2 |
| | $H_2O$ release (molecules/$cm^3$) | $6 \times 10^{16}$ | $9 \times 10^{16}$ |
| | Ba in an inner surface layer (μg/$cm^2$) | None | 250 |
| Evaluations | Single crystal multiple pulling operations | Δ | ○ |
| | Impurity level of a transparent layer | Δ | ○ |
| | Voids and pinholes | ○ | ○ |

TABLE 5

| Example number | | Example 9 | Example 10 |
|---|---|---|---|
| First raw material powder | | Natural quartz powder with particle size of 50 to 500 μm | Natural quartz powder with particle size of 50 to 500 μm |
| Second raw material powder | | Synthetic cristobalite powder with particle size of 100 to 300 μm | Synthetic cristobalite powder with particle size of 100 to 300 μm |
| Method for molding a temporary compact | | Rotational molding method in graphite mold | Rotational molding method in graphite mold |
| Method for melting a temporary compact | | Reduced-pressure arc discharge melting method | Reduced-pressure arc discharge melting method |
| Atmospheric gas for melting a temporary compact | | He 95% by volume, $H_2$ 5% by volume | He 90% by volume, $H_2$ 10% by volume |
| Atmospheric gas for melting additional layer | | He 95% by volume, $H_2$ 5% by volume | He 90% by volume, $H_2$ 10% by volume |
| Atmospheric gas at the time of cooling | | $N_2$ 80% by volume, $O_2$ 20% by volume | $N_2$ 80% by volume, $O_2$ 20% by volume |
| Physical properties of a straight body portion | Color tone | Outside white and opaque/inside colorless and transparent | Outside white and opaque/inside colorless and transparent |
| | Outer diameter, height, thickness (mm) | Outer diameter 800 × Height 360 × Thickness 17 | Outer diameter 800 × Height 360 × Thickness 17 |
| | OH group (ppm by mass) | 60 to 70 | 40 to 50 |
| | Al (ppm by mass) | 20 | 20 |
| Physical properties of a bottom portion | Color tone | colorless and transparent to translucent | colorless and transparent to translucent |
| | Thickness (mm) | 18 | 18 |
| | OH group (ppm by mass) | 3 | <3 |
| | Al (ppm by mass) | 20 | 20 |
| | $H_2O$ release (molecules/cm$^3$) | $<5 \times 10^{16}$ | $<5 \times 10^{16}$ |
| | Ba in an inner surface layer (μg/cm$^2$) | None | None |
| Evaluations | Single crystal multiple pulling operations | Δ | ○ |
| | Impurity level of a transparent layer | ○ | ○ |
| | Voids and pinholes | ○ | ○ |

TABLE 6

| Example number | | Comparative Example 1 | Comparative Example 2 |
|---|---|---|---|
| First raw material powder | | Natural quartz powder with particle size of 100 to 300 μm | Natural quartz powder with particle size of 100 to 300 μm |
| Second raw material powder | | None | Synthetic cristobalite powder with particle size of 100 to 300 μm |
| Method for molding a temporary compact | | Rotational molding method in graphite mold | Rotational molding method in graphite mold |
| Method for melting a temporary compact | | Reduced-pressure arc discharge melting method | Atmospheric arc discharge melting method |
| Atmospheric gas for melting a temporary compact | | Air | Air |
| Atmospheric gas for melting additional layer | | — | Air |
| Atmospheric gas at the time of cooling | | Air | Air |
| Physical properties of a straight body portion | Color tone | Outside white and opaque/inside colorless and transparent | Outside white and opaque/inside colorless and transparent |
| | Outer diameter, height, thickness (mm) | 8Outer diameter 800 × Height 360 × Thickness 16 | Outer diameter 800 × Height 360 × Thickness 17 |
| | OH group (ppm by mass) | 50 to 60 | 90 to 120 |
| | Al (ppm by mass) | 2 | 2 |

TABLE 6-continued

| Example number | | Comparative Example 1 | Comparative Example 2 |
|---|---|---|---|
| Physical properties of a bottom portion | Color tone | Outside white and opaque/inside colorless and transparent | Outside white and opaque/inside colorless and transparent |
| | Thickness (mm) | 17 | 18 |
| | OH group (ppm by mass) | 40 to 50 | 90 to 110 |
| | Al (ppm by mass) | 2 | 2 |
| | $H_2O$ release (molecules/cm$^3$) | $3 \times 10^{17}$ | $6 \times 10^{17}$ |
| | Ba in an inner surface layer (μg/cm$^2$) | 500 (inner surface entire coating) | None |
| Evaluations | Single crystal multiple pulling operations | ○ | Δ |
| | Impurity level of a transparent layer | Δ | ○ |
| | Voids and pinholes | x | x |

TABLE 7

| Example number | | Comparative Example 3 | Comparative Example 4 |
|---|---|---|---|
| First raw material powder | | Natural quartz powder with particle size of 50 to 500 μm | Natural quartz powder with particle size of 50 to 500 μm |
| Second raw material powder | | None | Synthetic cristobalite powder with particle size of 100 to 300 μm |
| Method for molding a temporary compact | | Rotational molding method in graphite mold | Rotational molding method in graphite mold |
| Method for melting a temporary compact | | Reduced-pressure arc discharge melting method | Atmospheric arc discharge melting method |
| Atmospheric gas for melting a temporary compact | | Air | Humidified air |
| Atmospheric gas for melting additional layer | | — | Humidified air |
| Atmospheric gas at the time of cooling | | Air | Air |
| Physical properties of a straight body portion | Color tone | Outside white and opaque/inside colorless and transparent | Outside white and opaque/inside colorless and transparent |
| | Outer diameter, height, thickness (mm) | Outer diameter 800 × Height 360 × Thickness 16 | Outer diameter 800 × Height 360 × Thickness 17 |
| | OH group (ppm by mass) | 40 to 50 | 300 to 330 |
| | Al (ppm by mass) | 2 | 2 |
| Physical properties of a bottom portion | Color tone | Outside white and opaque/inside colorless and transparent | Outside white and opaque/inside colorless and transparent |
| | Thickness (mm) | 17 | 18 |
| | OH group (ppm by mass) | 40 to 50 | 250 to 260 |
| | Al (ppm by mass) | 2 | 2 |
| | $H_2O$ release (molecules/cm$^3$) | $3 \times 10^{17}$ | $10 \times 10^{17}$ |
| | Ba in an inner surface layer (μg/cm$^2$) | None | None |
| Evaluations | Single crystal multiple pulling operations | Δ | x |
| | Impurity level of a transparent layer | x | Δ |
| | Voids and pinholes | x | x |

TABLE 8

| Example number | Example 1 | Example 3 | (unit: ppb by mass) Comparative Example 2 |
|---|---|---|---|
| Li | 100 | 30 | 20 |
| Na | 1200 | 80 | 70 |
| K | 250 | 40 | 30 |
| Ti | 700 | 10 | 20 |
| Cr | 250 | 10 | 20 |
| Fe | 300 | 30 | 20 |
| Ni | 100 | 15 | 20 |
| Cu | 150 | 10 | 10 |
| Zn | 30 | 5 | 5 |
| Zr | 320 | 30 | 30 |
| Mo | 50 | 10 | 10 |
| W | 30 | 5 | 5 |
| Pb | 30 | 10 | 10 |

As is clear from Tables 1 to 8, in Examples 1 to 10, single crystal silicon with a small number of voids and pinholes could be produced.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A single-crystal silicon pulling silica container comprising a straight body portion, a curved portion, and a bottom portion, wherein
the OH group concentration in the entirety of the straight body portion is 30 to 300 ppm by mass,
the OH group concentration in the entirety of the bottom portion is 30 ppm by mass or less, and
a difference in the OH group concentration between the entirety of the straight body portion and the entirety of the bottom portion is 30 ppm by mass or more.

2. The single-crystal silicon pulling silica container according to claim 1, wherein
an outside of the straight body portion is made of opaque silica glass containing gaseous bubbles, an inside of the straight body portion is made of transparent silica glass containing substantially no gaseous bubble, and the bottom portion is made of translucent silica glass containing fewer gaseous bubbles than the opaque silica glass or transparent silica glass containing substantially no gaseous bubble.

3. The single-crystal silicon pulling silica container according to claim 1, wherein
an amount of released $H_2O$ in the bottom portion is $1\times10^{17}$ molecules/$cm^3$ or less.

4. The single-crystal silicon pulling silica container according to claim 2, wherein
an amount of released $H_2O$ in the bottom portion is $1\times10^{17}$ molecules/$cm^3$ or less.

5. The single-crystal silicon pulling silica container according to claim 1, wherein
Ba is contained in an inner surface layer of the bottom portion in concentrations of 100 to 1000 ppm by mass or Ba is applied to an inner surface of the bottom portion in concentrations of 100 to 1000 μg/$cm^2$.

6. The single-crystal silicon pulling silica container according to claim 2, wherein
Ba is contained in an inner surface layer of the bottom portion in concentrations of 100 to 1000 ppm by mass or Ba is applied to an inner surface of the bottom portion in concentrations of 100 to 1000 μg/$cm^2$.

7. The single-crystal silicon pulling silica container according to claim 3, wherein
Ba is contained in an inner surface layer of the bottom portion in concentrations of 100 to 1000 ppm by mass or Ba is applied to an inner surface of the bottom portion in concentrations of 100 to 1000 μg/$cm^2$.

8. The single-crystal silicon pulling silica container according to claim 4, wherein
Ba is contained in an inner surface layer of the bottom portion in concentrations of 100 to 1000 ppm by mass or Ba is applied to an inner surface of the bottom portion in concentrations of 100 to 1000 μg/$cm^2$.

9. The single-crystal silicon pulling silica container according to claim 1, wherein the OH group concentration in the entirety of the bottom portion is 10 ppm by mass or less.

10. The single-crystal silicon pulling silica container according to claim 1, wherein the difference in the OH group concentration between the entirety of the straight body portion and the entirety of the bottom portion is 60 ppm by mass or more.

11. A method for producing a single-crystal silicon pulling silica container comprising a straight body portion, a curved portion, and a bottom portion, wherein
the OH group concentration in the entirety of the straight body portion is 30 to 300 ppm by mass,
the OH group concentration in the entirety of the bottom portion is 30 ppm by mass or less, and
a difference in the OH group concentration between the entirety of the straight body portion and the entirety of the bottom portion is 30 ppm by mass or more,
the method comprising:
a step of making silica powder having a particle size of 10 to 1000 μm as first raw material powder;
a step of obtaining a temporary compact by charging the first raw material powder into a mold having rotational symmetry, the mold with a bottom portion having holes for pressure reduction, and temporarily molding the first raw material powder into a predetermined shape corresponding to an inner wall of the mold by rotating the mold; and
a discharge heating melting step of performing heating and melting of the temporary compact by a discharge heating melting method with carbon electrodes placed in the temporary compact while supplying gas containing hydrogen by performing degassing by reducing pressure from an outside of the mold in a bottom portion of the temporary compact.

12. The method for producing a single-crystal silicon pulling silica container according to claim 11, comprising:
a step of making silica powder having a particle size of 10 to 1000 μm, the silica powder whose purity is higher than a purity of the first raw material powder, as second raw material powder; and
a step of further forming a transparent silica glass layer containing substantially no gaseous bubble on an inner surface of the silica container by heating and melting the second raw material powder by the discharge heating melting method while spreading the second raw material powder from an upper part of the silica container at least after the discharge heating melting step of the temporary compact.

13. The method for producing a single-crystal silicon pulling silica container according to claim 12, wherein
a barium compound is mixed into the second raw material powder for forming the transparent silica glass layer on an inner surface of the bottom portion of the silica container in such a way that a Ba concentration becomes 100 to 1000 ppm by mass.

14. The method for producing a single-crystal silicon pulling silica container according to claim 11, comprising:
   a step of applying a barium compound solution to an inner surface of the bottom portion of the silica container in such a way that a concentration of Ba becomes 100 to 1000 µg/cm$^2$ and drying the barium compound solution.

15. The method for producing a single-crystal silicon pulling silica container according to claim 12, comprising:
   a step of applying a barium compound solution to an inner surface of the bottom portion of the silica container in such a way that a concentration of Ba becomes 100 to 1000 µg/cm$^2$ and drying the barium compound solution.

16. The method for producing a single-crystal silicon pulling silica container according to claim 11, wherein the OH group concentration in the entirety of the bottom portion is 10 ppm by mass or less.

17. The method for producing a single-crystal silicon pulling silica container according to claim 11, wherein the difference in the OH group concentration between the entirety of the straight body portion and the entirety of the bottom portion is 60 ppm by mass or more.

* * * * *